United States Patent [19]
Nonaka

[11] Patent Number: 5,914,568
[45] Date of Patent: Jun. 22, 1999

[54] PLASMA PROCESSING APPARATUS

[75] Inventor: Ryo Nonaka, Yamanashi-ken, Japan

[73] Assignee: Tokyo Electron Limited, Tokyo, Japan

[21] Appl. No.: 09/041,795

[22] Filed: Mar. 13, 1998

[30] Foreign Application Priority Data

Mar. 19, 1997 [JP] Japan .................................. 9-085744

[51] Int. Cl.⁶ ................................................. H01J 7/24
[52] U.S. Cl. ............................... 315/111.21; 315/111.41; 361/234
[58] Field of Search ......................... 315/111.21, 111.41; 361/234

[56] References Cited

U.S. PATENT DOCUMENTS

| | | | |
|---|---|---|---|
| 4,911,814 | 3/1990 | Matsuoka et al. | 315/111.41 |
| 5,055,964 | 10/1991 | Logan et al. | 361/234 |
| 5,547,539 | 8/1996 | Arasawa et al. | 156/626.1 |
| 5,671,116 | 9/1997 | Husain | 361/234 |
| 5,671,117 | 9/1997 | Sherstinsky et al. | 361/234 |
| 5,764,471 | 6/1998 | Burkhart | 361/234 |

FOREIGN PATENT DOCUMENTS 6-342843 12/1994 Japan .

*Primary Examiner*—Michael B Shingleton
*Attorney, Agent, or Firm*—Oblon, Spivak, McClelland, Maier & Neustadt, P.C.

[57] ABSTRACT

A plasma processing apparatus has a susceptor with a mount surface on which an electrostatic chuck is arranged. The electrostatic chuck is formed of one inner chuck segment and four outer chuck segments. The chuck segments are arrayed with gaps interposed therebetween to prevent the electrostatic chuck from being distorted due to thermal stress.

20 Claims, 4 Drawing Sheets

PLASMA PROCESSING APPARATUS

BACKGROUND OF THE INVENTION

The present invention relates to a plasma processing apparatus for subjecting a target object, such as a semiconductor wafer, to a plasma process in an airtight vacuum process chamber, and more particularly to an improvement of an electrostatic chuck for holding the target object on a worktable arranged in the process chamber.

As an electrostatic chuck used in recent years, such a structure is known that is constituted by an insulating member made of, for example, ceramic, and a conductive film made of, for example, tungsten and disposed in the insulating member. When a predetermined DC voltage is applied to the conductive film, Coulomb force and Johnsen-Rahbeck force are generated on the insulating member, so that a semiconductor wafer is attracted and held thereby on the chucking surface of the electrostatic chuck.

The electrostatic chuck using ceramic as an insulating body as described above is prepared as an integratedly formed article having a diameter almost the same as that of the wafer, and then is attached to the mount surface of a worktable. For example, the electrostatic chuck is fabricated by sandwiching a conductive film of tungsten between a pair of ceramic plates, and heating them at a high temperature to bond them. When the heat treatment is performed, the electrostatic chuck is greatly shrunk and generates thermal stress, whereby the chuck may be distorted. Once the distortion is caused, the resultant shape remains after the electrostatic chuck is cooled down and never recovers the original shape given before the heat treatment. Accordingly, if the electrostatic chuck causes the distortion, the chuck is subjected to a polishing treatment after the heat treatment, so that it has a uniformly flat surface.

In recent years, ultra fine processing techniques have been developed to a great extent, and make it possible to perform a uniform process even on a large wafer, for example, of 12 inches or more. However, a large electrostatic chuck for such a large wafer tends to be distorted due to thermal stress caused by heat, for example, in a plasma process. This kind of distortion of an electrostatic chuck due to thermal stress becomes more prominent as the chuck size is increased. When an electrostatic chuck is distorted, so is a wafer thereon, thereby hindering the wafer from being uniformly processed. Further, even where a wafer of less than 12 inches, which was not so influenced by distortion of an electrostatic chuck, is processed by a recent ultra fine processing technique, the influence of the distortion sometimes cannot be ignored under severe conditions.

On the other hand, when an electrostatic chuck is heat treated to bond it to the mother body, i.e., a work table, in a process of manufacturing the chuck, the chuck tends to be more easily distorted due to thermal stress caused by difference in thermal expansion between the mother body and the chuck, as its size is increased. As described above, where some unevenness is formed on the chucking surface of the chuck due to the heat treatment, the chucking surface is subjected to a polishing treatment and flattened. In this case, a difference in distance from its conductive film to the chucking surface is brought about between the center and the periphery of the electrostatic chuck. This difference results in a difference in attraction force to a wafer, between the center and the periphery of the electrostatic chuck, thereby raising a difficulty in uniformly holding the wafer. Besides, where an electrostatic chuck greatly distorted is subjected to a polishing treatment, its conductive film may be exposed.

Further, a large electrostatic chuck requires a large manufacturing system which is contrary to present demands for compact facilities. A large electrostatic chuck also requires a large insulating member and a large conductive film, which entail complicated operations and high costs in their manufacturing process and transportation.

BRIEF SUMMARY OF THE INVENTION

An object of the present invention is to provide a plasma processing apparatus having an electrostatic chuck which is prevented from being distorted due to heat in a plasma process, so that a target object is uniformly processed.

Another object of the present invention is to provide a plasma processing apparatus having an electrostatic chuck for a large target object, which is fabricated easily and at a low cost.

According to a first aspect of the present invention, there is provided a plasma processing apparatus for processing a target substrate, using a plasma, comprising:

an airtight process chamber;

exhaust means for exhausting and setting the process chamber into a vacuum state;

process gas supply means for supplying a process gas into the process chamber;

an electric-field generator for generating an RF electric field in the process chamber to convert the process gas into plasma;

a worktable arranged in the process chamber and having a mount surface for supporting the target substrate;

an electrostatic chuck fixed to the mount surface, for attracting and holding the target object, the electrostatic chuck comprising at least three chuck segments arranged with a gap interposed therebetween to prevent the electrostatic chuck from being distorted due to thermal stress, each chuck segment having a pair of insulating ceramic layers and a conductive layer sandwiched therebetween; and a DC power supply section for supplying the conductive layer of each chuck segment with a DC electric potential.

According to a second aspect of the present invention, there is provided a plasma processing apparatus for processing a target substrate, using a plasma, comprising:

an airtight process chamber;

exhaust means for exhausting and setting the process chamber into a vacuum state;

process gas supply means for supplying a process gas into the process chamber;

a lower electrode arranged in the process chamber and having a mount surface for supporting the target substrate;

an upper electrode arranged in the process chamber and facing the lower electrode;

an RF power supply section for applying an RF power between the upper and lower electrodes and generating an RF electric field in the process chamber to convert the process gas into plasma;

an electrostatic chuck fixed to the mount surface, for attracting and holding the target object, the electrostatic chuck comprising an inner chuck segment and an outer chuck section concentrically arranged relative to a center of the mount surface with a gap interposed therebetween to prevent the electrostatic chuck from being distorted due to thermal stress, the outer chuck section comprising at least three chuck segments arranged with a gap interposed therebetween to prevent the electrostatic chuck from being distorted due to thermal stress, each chuck segment having a pair of insulating ceramic layers and a conductive layer sandwiched therebetween; and a DC power supply section for supplying the conductive layer of each chuck segment with a DC electric potential.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
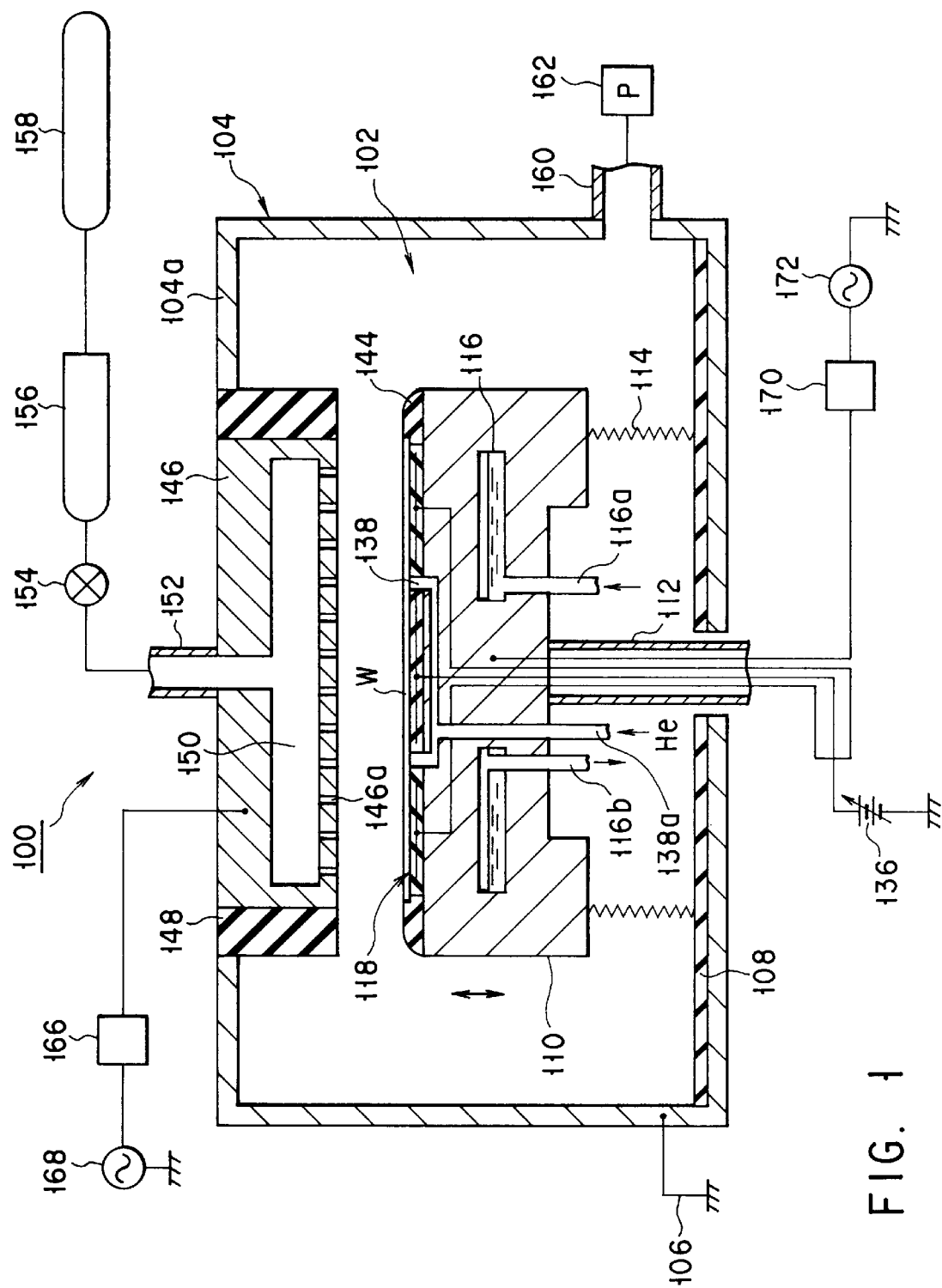
FIG. 1 is a cross-sectional view schematically showing an etching apparatus which exemplifies a plasma processing apparatus according to an embodiment of the present invention.

In the following embodiments, the same reference numerals denote corresponding parts, and repetitive descriptions will be given only where necessary.

The etching apparatus 100 has a process field 102 arranged in an essentially cylindrical process chamber 104 which is airtightly closed and opened. The chamber 104 is formed of a conductive material, such as aluminum having an anodic oxide surface, and is grounded through a ground line 106. A support plate 108 formed of an insulating material, such as ceramic, is arranged on the bottom of the process chamber 104. A susceptor 110 having an essentially cylindrical shape and functioning as a lower electrode is arranged on the insulating plate 108. The susceptor 110 has a mount surface for supporting thereon a target object, such as a semiconductor wafer having a diameter of 12 inches.

The susceptor 110 is supported by an elevating shaft 112 which penetrates the support plate 108 and the bottom of the process chamber 104. The elevating shaft 112 is vertically moved by a driving mechanism (not shown) arranged outside the process chamber 104. In short, the susceptor 110 is arbitrarily moved in a vertical direction by an operation of the driving motor, as indicated with a bidirectional arrow in FIG. 1. An expandable seal member, such as a bellows 114, is arranged between the susceptor 110 and the insulating support plate 108 so as to surround the elevating shaft 112 and to ensure airtightness of the process field 102.

The susceptor 110 is formed of a conductive material, such as aluminum having an anodic oxide surface. In the susceptor 110, temperature control means, such as heating means (not shown), e.g., a ceramic heater or the like, and a chiller circulation passageway 116 connected to an outside chiller source (not shown) through an inlet pipe 116a and an outlet pie 116b. A chiller, such as ethylene glycol, from the chiller source is circulated in the chiller circulation passageway 116. With the temperature control means, it is possible to keep the wafer W on the susceptor 110 at a predetermined temperature. The temperature of the wafer W is automatically controlled by a temperature sensor (not shown) for detecting the temperature of the susceptor 110 and a temperature controlling mechanism (not shown).

On the mount surface of the susceptor 110, there are an electrostatic chuck 118 for attracting and holding the wafer W, and a focus ring 144 surrounding the electrostatic chuck 118. These members 118 and 144 will be explained later.

An upper electrode 146 is arranged to face the mount surface of the susceptor 110. The upper electrode 146 is formed of a conductive material, such as aluminum having an anodic oxide surface, and has an essentially cylindrical shape. The upper electrode 146 is attached to the ceiling 104a of the process chamber 104 through an insulating ring 148 having an essentially circular shape and formed of an insulating material, such as ceramic. The upper electrode functions as a shower head for supplying a process gas. Accordingly, the upper electrode, i.e., shower head 146 is provided with a space 150 formed therein, and a number of gas spouting holes 146a formed on its surface facing the susceptor 110 to communicate with the space.

At the center of the top of the upper electrode, i.e., shower head 146, there is a gas introduction pipe 152 connected to the space 150. A process gas supply source 158 is connected to the gas introduction pipe 152 through a valve 154 and a mass flow controller (MFC) 156. When a plasma process is performed, a predetermined process gas, such as mixture of $CF_4$ and $O_2$ for etching a silicon oxide film, is supplied to the space form the gas supply source 158. The process gas in the space 150 is uniformly spouted through the gas spouting holes 146a onto the target surface of the wafer W.

An exhaustion pipe 160 is connected to the lower portion of the process chamber 104 and communicates with vacuum exhausting means 162, such a vacuum pump formed of a turbo-molecular pump. With the vacuum exhausting means 162, the process field 102 is vacuum-exhausted to a predetermined vacuum pressure of from several mTorr to several hundreds mTorr.

An RF (Radio Frequency) power supply system of the etching apparatus 100 is connected to the upper electrode 146 and susceptor 110. Specifically, a first RF power supply 168 is connected through a first matching member 166 to the upper electrode 146. On the other hand, a second RF power supply 172 is connected through a second matching member 170 to the susceptor 110.

When a plasma process is performed, the upper electrode 146 is supplied with a predetermined RF power of, for example, 13. 56 MHz from the first RF power supply 168. With this power, an RF electric field is generated in the process field 102, and the supplied process gas is dissociated and converted into plasma. Simultaneously, the susceptor 110 is supplied with a predetermined RF power of, for example, 380 kHz for biasing, from the second RF power supply 172. With this power, ions in the plasma are effectively attracted to the target surface of the wafer W.

The electrostatic chuck 118 arranged on the mount surface of the susceptor 110 will be explained in detail.

The electrostatic chuck 118 is formed of a plurality of segments adhered and fixed to the mount surface of the susceptor 110 and has an outer contour with a diameter almost the same as a wafer of 12 inches, as a whole. Specifically, the electrostatic chuck 118 includes an inner chuck segment 120 having a circular shape and an outer chuck section 121 having a circular ring shape which are concentrically arranged relative to the center of the mount surface. The inner chuck segment 120 and the outer chuck section 121 are arranged with a gap 124 interposed therebetween in a radial direction to prevent the electrostatic chuck 118 from being distorted due to thermal stress generated by a change in temperature.

The outer chuck section 121 has four outer chuck segments 122 having substantially the same fan-shape, and equidistantly arranged in an angular direction relative to the center of the mount surface. The outer chuck segments 122 are arranged with gaps 126 interposed therebetween in an angular direction to prevent the electrostatic chuck 118 from being distorted due to thermal stress generated by a change in temperature. The gaps 126 consist of four gaps 126 having substantially the same shape, and formed at positions between respective pairs of adjacent two of the four outer chuck segments 122.

Each of the chuck segments 120 and 122 has a pair of insulating ceramic layers 132, which are capable of sufficiently transferring heat and withstanding plasma, and a conductive thin layer 128 formed of a conductive material, such as tungsten, and sandwiched between the ceramic layers 132. Each of the insulating ceramic layer 132 has a thickness of, for example, several hundreds $\mu$m, while the conductive thin layer 128 has a thickness of, for example, several $\mu$m.

The conductive thin layers 128 of the chuck segments 120 and 122 are substantially simultaneously supplied with substantially the same DC potential, from a variable DC power supply 136. Specifically, the variable DC power supply 136 applies a predetermined high voltage of, for example, from 1.0 kV to 2.5 kV, between the conductive thin layer 128 and the ground. When a DC potential is applied to the conductive thin film 128, Coulomb force and Johnsen-Rahbeck force are generated, due to the electric charges, on the upper insulating layer 132, i.e., on the chucking surface. With the Coulomb force and Johnsen-Rahbeck force, the wafer W is attracted and held on the chucking surface of the electrostatic chuck 118, and thus fixed to the susceptor 110.

Figure 3:
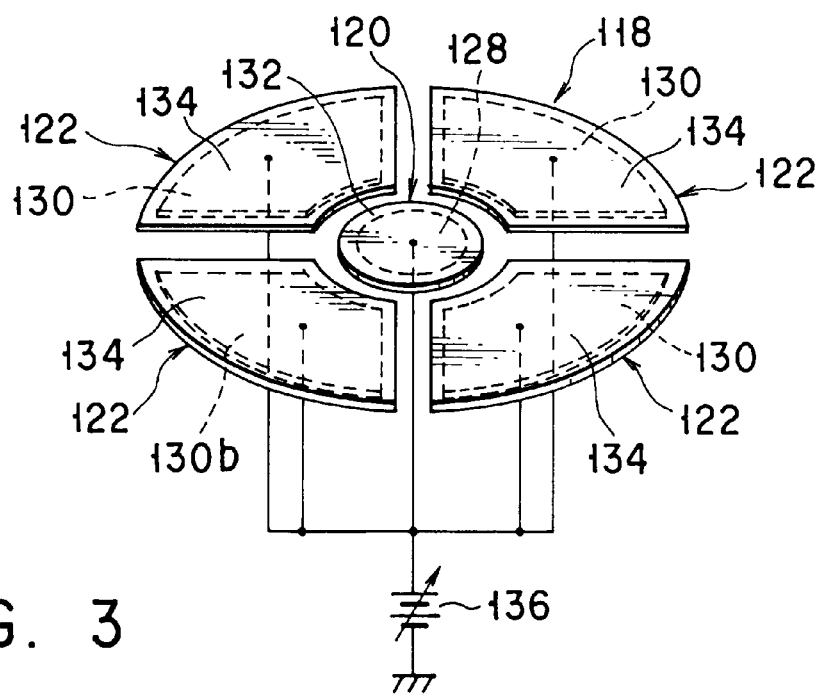
FIG. 3 is a perspective view schematically showing an electrostatic chuck used in the etching apparatus shown in FIG. 1, in a state where it is detached from the susceptor.

Although the electrostatic chuck shown in FIG. 3 is of the unipolar type, in which the chuck segments 120 and 122 are supplied with the same DC voltage of the same polarity, the present invention is not limited to the arrangement shown in FIG. 3. For example, the inner chuck segment 120 may be supplied with a voltage lower than that applied to the outer chuck section 121, or may be supplied with no voltage if no problem is caused in relation to the attraction force of the electrostatic chuck 118. Further, the present invention can be applied to an electrostatic chuck of the bipolar type.

The susceptor 110 is provided with heat transfer gas supply means for supplying a heat transfer gas, such as He, into an interstice between the electrostatic chuck 118 and the wafer W mounted thereon. The heat transfer gas supply means has a plurality of supply holes 138 arranged on the mount surface of the susceptor 110 at positions corresponding to the gaps 124 and 126, for supplying the heat transfer gas. The supply holes 138 are connected to an outside gas supply source (not shown) through an introduction pipe 138$a$, as shown in FIG. 1. The supply holes 138 are formed only at positions corresponding to the gaps 124 and 126, and not formed at positions corresponding to the chuck segments 120 and 122.

Figure 2:
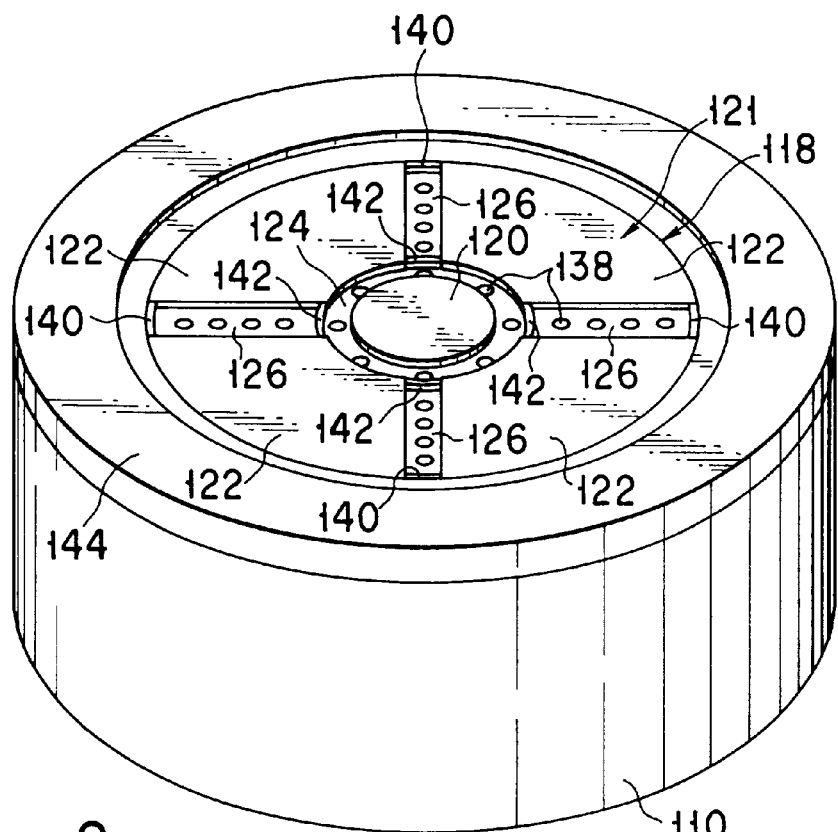
FIG. 2 is a perspective view schematically showing a susceptor arranged in the etching apparatus shown in FIG. 1.

The outer end of each gap 126 is closed by a seal member 140, as shown in FIG. 2. The seal member 140 airtightly isolates, from the atmosphere in the process field 102, a passage formed between the mount surface and the wafer W to correspond to the gap 126, in a state where the wafer W is mounted on the electrostatic chuck 118. The seal member 140 is formed of a material preferably insulating and more preferably elastic, such as ceramic, polyimide resin, or the like.

The seal member 140 hinders plasma from entering the gap 126 during a plasma process. As a result, it is possible to prevent the electrostatic chuck 118 and susceptor 110 from being damaged, and to prevent abnormal electric discharge from occurring. Further, the seal member 140 prevents the heat transfer gas from leaking into the process field 102.

A partition wall 142 is arranged between each gap 126 and the gap 124, as shown in FIG. 2. The partition walls 142 airtightly isolate, from each other, passages formed between the mount surface and the wafer W to correspond to the gaps 126 and 124, in a state where the wafer W is mounted on the electrostatic chuck 118. The partition wall 142 is also formed of a material preferably insulating and more preferably elastic, such as ceramic, polyimide resin, or the like.

In a state where the wafer W is mounted on the electrostatic chuck 118, the heat transfer gas, such as He, is supplied from the supply holes 138 to the gaps 124 and 126, and is diffused into a minute interstice formed between the wafer W and the electrostatic chuck 118. With this gas, heat transfer between the wafer W and the electrostatic chuck 118 is uniformly and efficiently performed.

The heat transfer gas supply means is designed to allow the pressures of the plurality of passages to be different from each other on the basis of supply rates of the heat transfer gas, the passages being formed between the wafer W and the electrostatic chuck 118 to correspond to the gaps 124 and 126 partitioned by the partition walls 142. With this design, heat transfer efficiency between the wafer W and the susceptor 110 can be controlled, so that the entire target object is kept at a uniform temperature.

The susceptor 110 is provided with a plurality of lifter pins (not shown) arranged therein for moving the wafer W up and down relative to the electrostatic chuck 118. The electrostatic chuck 118 has throughholes (not shown), through which the lifter pins are projected and retreated relative to the chucking surface. The wafers W are transferred between the chucking surface and a transfer arm (not shown) with operation of the lifter pins.

A focus ring 144 is disposed on the mount surface of the susceptor 110 to surround the electrostatic chuck 118. The focus ring 144 is made of an insulating material, such as quartz. The focus ring 144 functions such that plasma is effectively incident on the wafer w to uniformly process the wafer W.

According to this embodiment, since the electrostatic chuck 118 is divided into the plurality of chuck segments 120 and 122 arrayed with gaps therebetween, the electrostatic chuck 118 is hardly distorted during a plasma process. As a result, the wafer W is held on a flat surface, so that the wafer is uniformly processed.

Further, since the electrostatic chuck 118 is formed by combining the small size chuck segments 120 and 122, the electrostatic chuck 118 can be easily manufactured. For example, even where an electrostatic chuck 118 having a size for a wafer W of 12 inches or more is manufactured, the manufacturing system size does not have to be increased.

Furthermore, since the chuck segments 120 and 122 are small, they are less distorted when heat-treated in their manufacturing process. Accordingly, the polished amount of the upper insulating ceramic layer 132, which is a conventional problem, is decreased. In other words, planar uniformity in the distance between the chucking surface and the conductive thin layer 128 in the electrostatic chuck 118 is improved, and so is planar uniformity in the attraction force of the electrostatic chuck to the wafer W.

Figure 4:
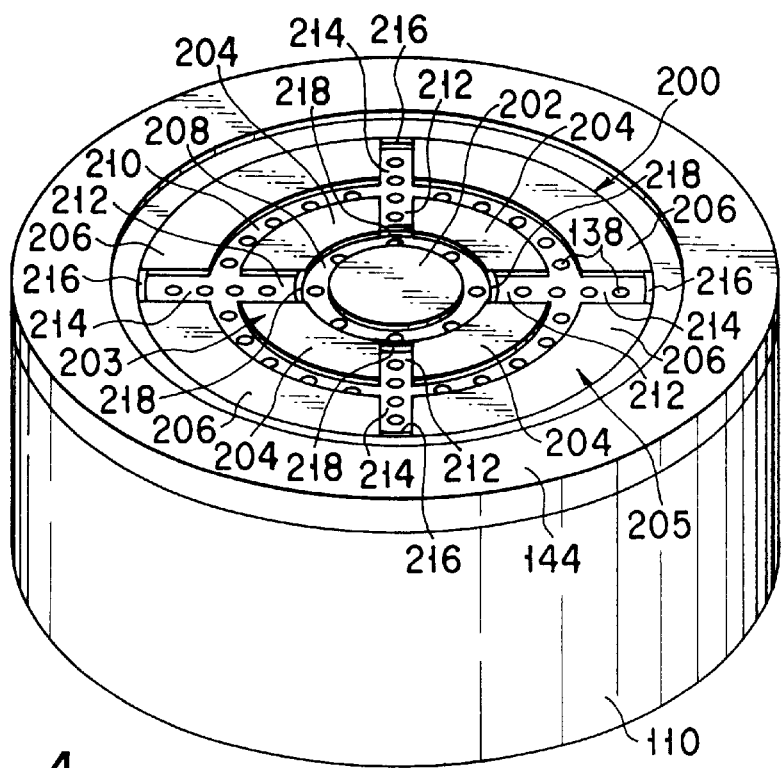
FIG. 4 is a perspective view schematically showing a susceptor having an electrostatic chuck according to another embodiment of the present invention.

FIG. 4 is a perspective view schematically showing a susceptor 110 having an electrostatic chuck 200 according to another embodiment of the present invention.

The electrostatic chuck 200 is formed of a plurality of segments adhered and fixed to the mount surface of the susceptor 110 and has an outer contour with a diameter almost the same as a wafer of 12 inches, as a whole. Specifically, the electrostatic chuck 200 includes an inner chuck segment 202 having a circular shape, an intermediate chuck section 203 having a circular ring shape, and an outer chuck section 205 having a circular ring shape, which are concentrically arranged relative to the center of the mount surface. The inner chuck segment 202, the intermediate chuck section 203, and the outer chuck section 205 are arranged with gaps 208 and 210 interposed therebetween in a radial direction to prevent the electrostatic chuck 200 from being distorted due to thermal stress generated by a change in temperature.

The intermediate chuck section 203 has four intermediate chuck segments 204 having substantially the same fan-shape, and equidistantly arranged in an angular direction relative to the center of the mount surface. The intermediate chuck segments 204 are arranged with gaps 212 interposed therebetween in an angular direction to prevent the electrostatic chuck 200 from being distorted due to thermal stress generated by a change in temperature. The gaps 212 consist of four gaps 212 having substantially the same shape, and formed at positions between respective pairs of adjacent two of the four intermediate chuck segments 204.

The outer chuck section 205 has four outer chuck segments 206 having substantially the same fan-shape, and equidistantly arranged in an angular direction relative to the center of the mount surface. The outer chuck segments 206 are arranged with gaps 214 interposed therebetween in an angular direction to prevent the electrostatic chuck 200 from being distorted due to thermal stress generated by a change in temperature. The gaps 214 consist of four gaps 214 having substantially the same shape, and formed at positions between respective pairs of adjacent two of the four outer chuck segments 206. The width of each gap 214 is set at the same as that of each gap 212, and the gaps 212 and 214 are lined up.

As in the chuck segments 120 and 122 of the electrostatic chuck 118, each of the chuck segments 202, 204, and 206 of the electrostatic chuck 200 also has a pair of insulating ceramic layers, and a conductive thin layer formed of a conductive material, such as tungsten, and sandwiched between the ceramic layers.

A plurality of supply holes 138 are arranged on the mount surface of the susceptor 110 at positions corresponding to the gaps 208, 210, 212, and 214, for supplying the heat transfer gas. The supply holes 138 are formed only at positions corresponding to the gaps 208, 210, 212, and 214, and not formed at positions corresponding to the chuck segments 202, 204, and 206. The outer end of each gap 214 is closed by a seal member 216, which has the same function as the seal member 140. A partition wall 218, which has the same function as the partition wall 142, is arranged between each gap 212 and the gap 208.

According to the embodiment shown in FIG. 4, since the electrostatic chuck 200 is divided into many chuck segments more than that in the embodiment shown in FIG. 2, the electrostatic chuck 200 is hardly distorted during a plasma process. As a result, the wafer W is held on a flat surface, so that the wafer is uniformly processed. Further, since the chuck segments of the electrostatic chuck 200 are smaller than those in the embodiments shown in FIG. 2, the electrostatic chuck 200 can be manufactured in a substantially smaller manufacturing system. Furthermore, the network of the gaps is spread over the entirety of the mount surface in the electrostatic chuck 200, the heat transfer gas is more uniformly supplied between the wafer W and the chucking surface.

Figure 5:
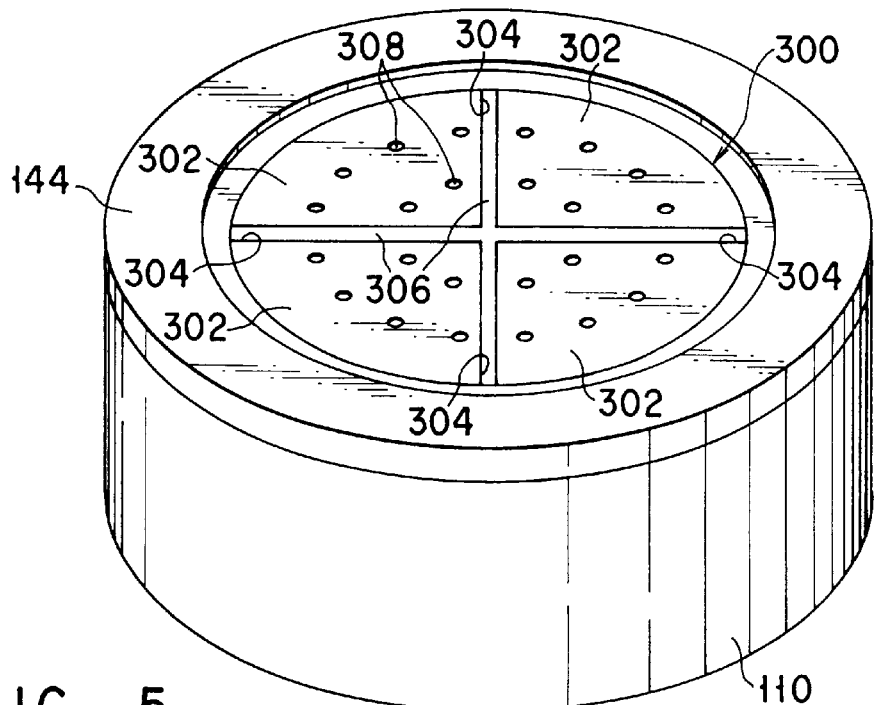
FIG. 5 is a perspective view schematically showing a susceptor having an electrostatic chuck according to still another embodiment of the present invention.

FIG. 5 is a perspective view schematically showing a susceptor 110 having an electrostatic chuck 300 according to still another embodiment of the present invention.

The electrostatic chuck 300 is formed of a plurality of segments adhered and fixed to the mount surface of the susceptor 110 and has an outer contour with a diameter almost the same as a wafer of 12 inches, as a whole. Specifically, the electrostatic chuck 300 has four chuck segments 302 having substantially the same fan-shape, and equidistantly arranged in an angular direction relative to the center of the mount surface. The chuck segments 302 are arranged with gaps 304 interposed therebetween in an angular direction to prevent the electrostatic chuck 300 from being distorted due to thermal stress generated by a change in temperature. The gaps 304 consist of four gaps 304 having substantially the same shape, and formed at positions between respective pairs of adjacent two of the four chuck segments 302. The width of each gap 304 is set at about 1 mm.

As in the chuck segments 120 and 122 of the electrostatic chuck 118, each of the chuck segments 302 of the electrostatic chuck 300 also has a pair of insulating ceramic layers, and a conductive thin layer formed of a conductive material, such as tungsten, and sandwiched between the ceramic layers.

A plurality of supply holes 308 are arranged to penetrate the chuck segments 302 from the mount surface, for supplying the heat transfer gas. The supply holes 308 are formed only at positions corresponding to the chuck segments 302, and not formed at positions corresponding to the gaps 304. The supply holes 308 are connected to an outside gas supply source (not shown) through an introduction pipe 138a (see FIG. 1). In a state where the wafer W is mounted on the electrostatic chuck 300, the heat transfer gas, such as He, is supplied from the supply holes 308 directly to a minute interstice formed between the wafer W and the electrostatic chuck 118 and is diffused therein. With this gas, heat transfer between the wafer W and the electrostatic chuck 300 is uniformly and efficiently performed.

The gaps 304 are filled with a filler 306, which is elastic and does not hinder the electrostatic chuck 300 in absorbing thermal stress, so that there are no substantial grooves left on the chucking surface. The filler 306 is formed of, for example, an elastic resin material which is capable of withstanding plasma.

According to the embodiment shown in FIG. 5, since the electrostatic chuck 300 is formed only of substantially the same chuck segments 302, the electrostatic chuck 300 is easily manufactured. In other words, an electrostatic chuck for a large wafer W can be manufactured without using facilities for fabricating chuck segments of different shapes. Further, even where the electrostatic chuck is larger, an increase in manufacturing cost is suppressed.

Figure 6:
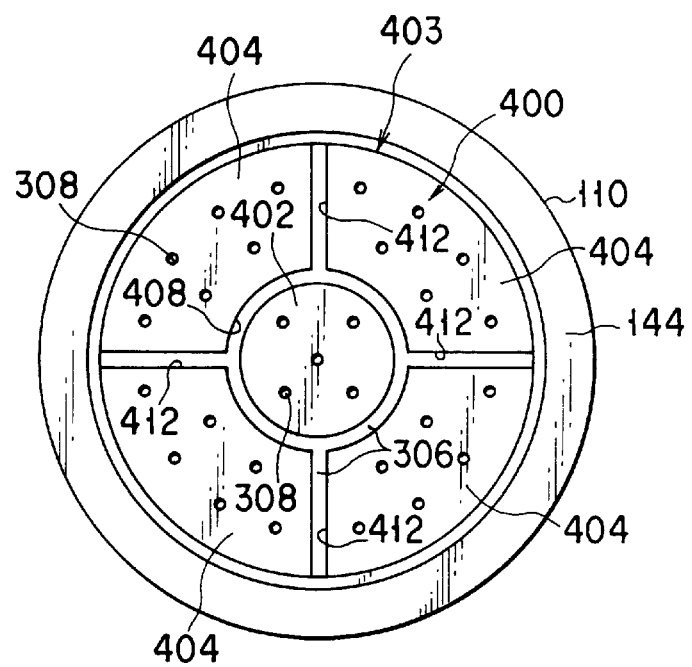
FIG. 6 is a plan view schematically showing a susceptor having an electrostatic chuck according to still another embodiment of the present invention.

FIG. 6 is a plan view schematically showing a susceptor 110 having an electrostatic chuck 400 according to still another embodiment of the present invention.

The electrostatic chuck 400 is formed of a plurality of segments adhered and fixed to the mount surface of the susceptor 110 and has an outer contour with a diameter almost the same as a wafer of 12 inches, as a whole. Specifically, the electrostatic chuck 400 includes an inner chuck segment 402 having a circular shape and an outer chuck section 403 having a circular ring shape which are concentrically arranged relative to the center of the mount surface. The inner chuck segment 402 and the outer chuck section 403 are arranged with a gap 408 interposed therebetween in a radial direction to prevent the electrostatic chuck 400 from being distorted due to thermal stress generated by a change in temperature. The width of the gap 408 is set at about 1 mm.

The outer chuck section 403 has four outer chuck segments 404 having substantially the same fan-shape, and equidistantly arranged in an angular direction relative to the center of the mount surface. The outer chuck segments 404 are arranged with gaps 412 interposed therebetween in an angular direction to prevent the electrostatic chuck 400 from being distorted due to thermal stress generated by a change in temperature. The gaps 412 consist of four gaps 412 having substantially the same shape, and formed at positions between respective pairs of adjacent two of the four outer chuck segments 404. The width of each gap 412 is set at about 1 mm.

As in the chuck segments 120 and 122 of the electrostatic chuck 118, each of the chuck segments 402 and 404 of the electrostatic chuck 400 also has a pair of insulating ceramic layers, and a conductive thin layer formed of a conductive material, such as tungsten, and sandwiched between the ceramic layers.

A plurality of supply holes 308 are arranged to penetrate the chuck segments 402 and 404 from the mount surface, for supplying the heat transfer gas. The supply holes 308 are formed only at positions corresponding to the chuck segments 402 and 404, and not formed at positions corresponding to the gaps 408 and 412. The gaps 408 and 412 are filled with a filler 306, which is elastic and does not hinder the electrostatic chuck 400 in absorbing thermal stress, so that there are no substantial grooves left on the chucking surface.

According to the embodiment shown in FIG. 6, since the electrostatic chuck 400 is divided in a radial direction, in addition to the arrangement of the embodiment shown in FIG. 5, the electrostatic chuck 400 is hardly distorted. Further, the chuck segments are smaller than those in FIG. 5, the electrostatic chuck 400 can present an improved productivity and an improved planar uniformity in attraction force.

Figure 7:
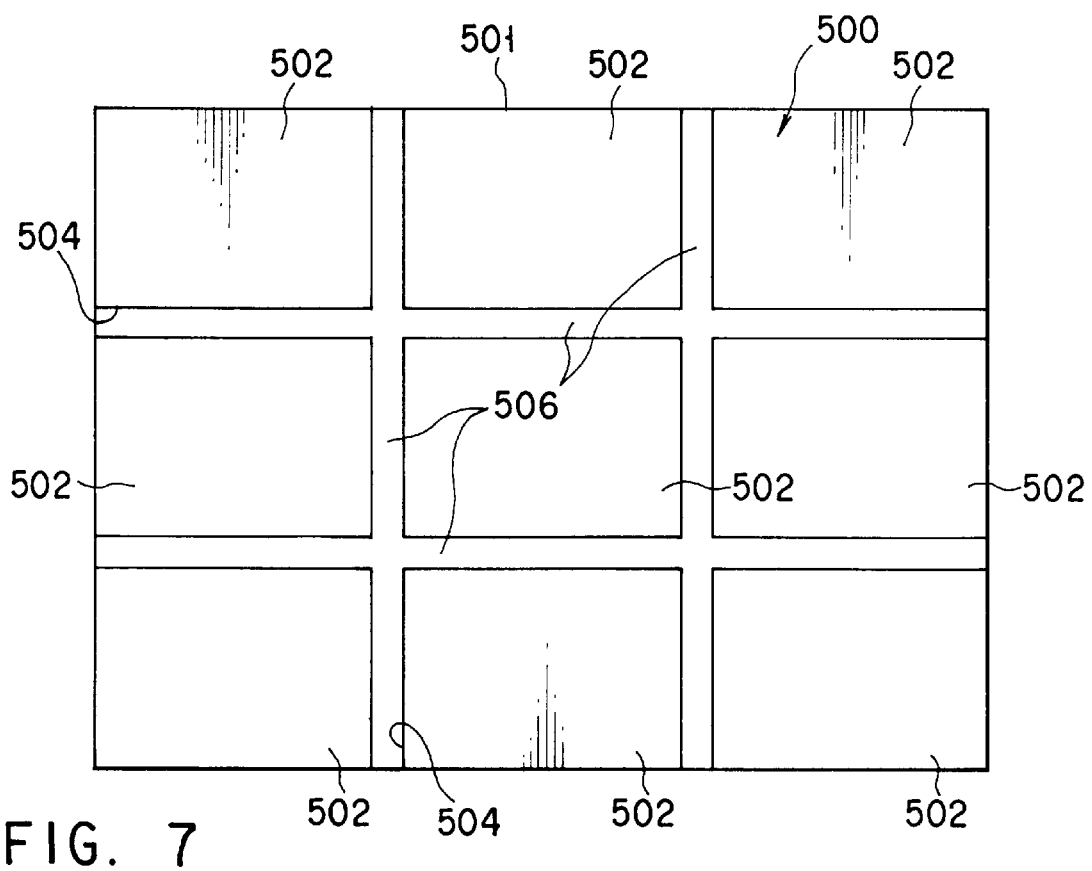
FIG. 7 is a plan view schematically showing a susceptor having an electrostatic chuck according to still another embodiment of the present invention.

FIG. 7 is a plan view schematically showing a susceptor 501 having an electrostatic chuck 500 according to still another embodiment of the present invention. The susceptor 501 is designed to hold a glass substrate for fabricating liquid crystal displays (LCDs).

The electrostatic chuck 500 is formed of a plurality of segments adhered and fixed to the mount surface of the susceptor 501 and has a rectangular outer contour with a size almost the same as a large LCD substrate, from which a plurality of LCD panels is fabricated, as a whole. Specifically, the electrostatic chuck 500 has nine chuck segments 502 having substantially the same rectangular shape, and equidistantly arranged in vertical and horizontal directions and in point-symmetry relative to the center of the mount surface. The chuck segments 502 are arranged with gaps 504 interposed therebetween in the vertical and horizontal directions to prevent the electrostatic chuck 500 from being distorted due to thermal stress generated by a change in temperature.

As in the chuck segments 120 and 122 of the electrostatic chuck 118, each of the chuck segments 502 of the electrostatic chuck 500 also has a pair of insulating ceramic layers, and a conductive thin layer formed of a conductive material, such as tungsten, and sandwiched between the ceramic layers.

The gaps 504 are filled with a filler 506, which is elastic and does not hinder the electrostatic chuck 500 in absorbing thermal stress, so that there are no substantial grooves left on the chucking surface. The filler 506 is formed of, for example, an elastic resin material which is capable of withstanding plasma.

According to the embodiment shown in FIG. 7, it is possible to prevent the electrostatic chuck from being distorted, and to attain an improved productivity and an improved planar uniformity in attraction force, as in the former embodiments which are designed to process a semiconductor wafer.

Note that the number of chuck segments constituting an electrostatic chuck is not limited to the embodiments shown in FIGS. 1 to 7. Where the electrostatic chuck is divided to have at least two gaps extending in intersecting directions, it is possible to prevent it from being distorted due to thermal stress. In light of this point and productivity of the electrostatic chuck, it should be divided into at least three chuck segments.

The position of the partition walls 142 and 218 may be altered on the basis of the cooling condition for a target object. The seal members 140 and 216, and the partition walls 142 and 218 may be formed as projections integrated with the mount surface of a susceptor. Although each of the above described embodiments employs an electrostatic chuck of the unipolar type, the present invention can be applied to an electrostatic chuck of the bipolar type. Further, the present invention can be applied to various kinds of plasma processing apparatus using an electrostatic chuck, such as ashing and film-formation apparatuses, as well as an etching apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A plasma processing apparatus for processing a target substrate, using a plasma, comprising:
   an airtight process chamber;
   exhaust means for exhausting and setting said process chamber into a vacuum state;
   process gas supply means for supplying a process gas into said process chamber;
   an electric-field generator for generating an RF electric field in said process chamber to convert said process gas into plasma;
   a worktable arranged in said process chamber and having a mount surface for supporting said target substrate;
   an electrostatic chuck fixed to said mount surface, for attracting and holding said target object, said electrostatic chuck comprising at least three chuck segments arranged with a gap interposed therebetween so as to separate said at least three chuck segments from each other, and to prevent said electrostatic chuck from being distorted due to thermal stress, each chuck segment having a pair of insulating ceramic layers and a conductive layer sandwiched therebetween; and
   a DC power supply section for supplying said conductive layer of each chuck segment with a DC electric potential.

2. The apparatus according to claim 1, wherein said DC power supply section is arranged to substantially simultaneously supply the conductive layers of said at least three chuck segments with DC electric potentials substantially the same as each other.

3. The apparatus according to claim 1, wherein said at least three chuck segments are arranged in an angular direction relative to a center of said mount surface.

4. The apparatus according to claim 1, wherein said at least three chuck segments have substantially the same shape.

5. The apparatus according to claim 1, wherein said electrostatic chuck comprises an inner chuck segment and an outer chuck section concentrically arranged relative to a center of said mount surface with a gap interposed therebetween to prevent said electrostatic chuck from being distorted due to thermal stress, said outer chuck section comprising said at least three chuck segments, said inner chuck segment having a pair of insulating ceramic layers and a conductive layer sandwiched therebetween, said DC power supply section being arranged to supply the conductive layer of said inner chuck segment with a DC electric potential.

6. The apparatus according to claim 5, wherein said DC power supply section is arranged to substantially simultaneously supply the conductive layers of said at least three chuck segments and said inner chuck segment with DC electric potentials substantially the same as each other.

7. The apparatus according to claim 5, wherein said at least three chuck segments are arranged in an angular direction relative to a center of said mount surface.

8. The apparatus according to claim 7, wherein said at least three chuck segments have substantially the same shape.

9. The apparatus according to claim 1, comprising heat transfer gas supply means for supplying a heat transfer gas into an interstice between said electrode chuck and said target object mounted thereon, wherein said heat transfer gas supply means has a plurality of supply holes formed in said mount surface at positions corresponding to said gap and has no supply holes at positions corresponding to said at least three chuck segments, for supplying said heat transfer gas.

10. The apparatus according to claim 9, wherein an outer end of said gap is closed by a seal member consisting essentially of an elastic material.

11. The apparatus according to claim 10, wherein a partition wall consisting essentially of an elastic material is arranged in said gap to divide said gap into regions.

12. The apparatus according to claim 11, wherein said heat transfer gas supply means is capable of setting said regions of said gap at different pressures on the basis of supply rates of said heat transfer gas, when said target object is mounted on said electrostatic chuck.

13. The apparatus according to claim 1, comprising heat transfer gas supply means for supplying a heat transfer gas into an interstice between said electrode chuck and said target object mounted thereon, wherein said heat transfer gas supply means has a plurality of supply holes formed to penetrate said at least three chuck segments from said mount surface and has no supply holes at positions corresponding to said gap, for supplying said heat transfer gas.

14. The apparatus according to claim 13, wherein said gap is filled with a filler consisting essentially of an elastic material.

15. A plasma processing apparatus for processing a target substrate, using a plasma, comprising:
   an airtight process chamber;
   exhaust means for exhausting and setting said process chamber into a vacuum state;
   process gas supply means for supplying a process gas into said process chamber;
   a lower electrode arranged in said process chamber and having a mount surface for supporting said target substrate;
   an upper electrode arranged in said process chamber and facing said lower electrode;
   an RF power supply section for applying an RF power between said upper and lower electrodes and generating an RF electric field in said process chamber to convert said process gas into plasma;
   an electrostatic chuck fixed to said mount surface, for attracting and holding said target object, said electrostatic chuck comprising an inner chuck segment and an outer chuck section concentrically arranged relative to a center of said mount surface with a gap interposed therebetween so as to separate said at least three chuck segments from each other, and to prevent said electrostatic chuck from being distorted due to thermal stress, said outer chuck section comprising at least three chuck segments arranged with a gap interposed therebetween to prevent said electrostatic chuck from being distorted due to thermal stress, each chuck segment having a pair of insulating ceramic layers and a conductive layer sandwiched therebetween; and
   a DC power supply section for supplying said conductive layer of each chuck segment with a DC electric potential.

16. The apparatus according to claim 15, wherein said at least three chuck segments are arranged in an angular direction relative to a center of said mount surface.

17. The apparatus according to claim 16, wherein said at least three chuck segments have substantially the same shape.

18. The apparatus according to claim 15, wherein said process gas supply means comprises a plurality of process gas spouting holes arranged on the bottom surface of said upper electrode.

19. The apparatus according to claim 15, further comprising a focus ring arranged on said mount surface to surround said electrostatic chuck.

20. The apparatus according to claim 15, wherein said process gas comprises an etching gas for etching said target object.

* * * * *